(12) United States Patent
Fujihara et al.

(10) Patent No.: US 11,462,525 B2
(45) Date of Patent: Oct. 4, 2022

(54) OPTICAL COUPLING DEVICE AND HIGH FREQUENCY DEVICE

(71) Applicants: Kabushiki Kaisha Toshiba, Tokyo (JP); Toshiba Electronic Devices & Storage Corporation, Tokyo (JP)

(72) Inventors: Mami Fujihara, Nakatsu Oita (JP); Naoya Takai, Yukuhashi Fukuoka (JP); Kazuki Tanaka, Kitakyushu Fukuoka (JP); Takenori Yasuzumi, Yokohama Kanagawa (JP); Yoshio Noguchi, Kitakyushu Fukuoka (JP); Tsuyoshi Tokiwa, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/014,382

(22) Filed: Sep. 8, 2020

(65) Prior Publication Data
US 2021/0249391 A1 Aug. 12, 2021

(30) Foreign Application Priority Data
Feb. 7, 2020 (JP) .............................. JP2020-019407

(51) Int. Cl.
*H01L 27/15* (2006.01)
*H01L 29/161* (2006.01)
(Continued)

(52) U.S. Cl.
CPC ............ *H01L 25/167* (2013.01); *H01L 24/48* (2013.01); *H01L 31/02005* (2013.01); *H01L 33/62* (2013.01); *H01L 2224/48137* (2013.01)

(58) Field of Classification Search
CPC . H01L 25/167; H01L 24/48; H01L 31/02005; H01L 33/62; H01L 2224/48137
See application file for complete search history.

(56) References Cited

U.S. PATENT DOCUMENTS 9,070,817 B2   6/2015  Fujimoto et al.
10,107,857 B2 * 10/2018  Takai ..................... H02S 40/44
(Continued)

FOREIGN PATENT DOCUMENTS

JP         5806994 B2   11/2015
JP         6402091 B2   10/2018
(Continued)

*Primary Examiner* — Ismail A Muse
(74) *Attorney, Agent, or Firm* — Allen & Overy LLP

(57) ABSTRACT

An optical coupling device includes a light receiving element provided with a first output terminal and a second output terminal, a light emitting element provided on the light receiving element, a first switching element, a first electrode plate, and a sealing member. The first switching element is provided side by side on the light receiving element. A first main terminal and a control terminal are provided on an upper surface of the first switching element. A second main terminal is provided on a lower surface of the first switching element. The first main terminal is connected to the first output terminal. The control terminal is connected to the second output terminal. An upper surface of the first electrode plate is connected to the second main terminal. The sealing member covers the light receiving element, the light emitting element, and the first switching element.

11 Claims, 7 Drawing Sheets

(51) Int. Cl.
*H01L 31/12* (2006.01)
*H01L 33/00* (2010.01)
*H01L 31/153* (2006.01)
*H01L 25/16* (2006.01)
*H01L 23/00* (2006.01)
*H01L 33/62* (2010.01)
*H01L 31/02* (2006.01)

(56) References Cited

U.S. PATENT DOCUMENTS

| | | | | |
|---|---|---|---|---|
| 2012/0199851 | A1* | 8/2012 | Hoshino | H01L 31/153 |
| | | | | 257/81 |
| 2014/0284629 | A1* | 9/2014 | Takai | H01L 31/165 |
| | | | | 257/82 |
| 2015/0060892 | A1* | 3/2015 | Noguchi | H01L 25/167 |
| | | | | 257/82 |
| 2015/0069423 | A1* | 3/2015 | Yamamoto | H01L 31/173 |
| | | | | 257/82 |
| 2015/0303180 | A1* | 10/2015 | Noguchi | H01L 25/167 |
| | | | | 257/82 |
| 2016/0268241 | A1* | 9/2016 | Yamamoto | H01L 31/167 |
| 2017/0069610 | A1* | 3/2017 | Takai | H01L 23/373 |
| 2017/0176519 | A1* | 6/2017 | Takai | H01L 22/34 |
| 2019/0019784 | A1 | 1/2019 | Takai | |

FOREIGN PATENT DOCUMENTS

| | | |
|---|---|---|
| JP | 2018-186292 A | 11/2018 |
| JP | 6438363 B2 | 12/2018 |

* cited by examiner

OPTICAL COUPLING DEVICE AND HIGH FREQUENCY DEVICE

CROSS-REFERENCE TO RELATED APPLICATIONS

This application is based upon and claims the benefit of priority from Japanese Patent Application No. 2020-019407, filed on Feb. 7, 2020; the entire contents of which are incorporated herein by reference.

FIELD

Embodiments described herein relate generally to an optical coupling device and a high frequency device.

BACKGROUND

Conventionally, an optical coupling device that controls a high frequency current by inputting a control signal to a switching element via a light emitting element and a light receiving element has been used. The optical coupling device is required to have good high frequency current transmission characteristics.

DETAILED DESCRIPTION

According to one embodiment, an optical coupling device includes a light receiving element provided with a first output terminal and a second output terminal, a light emitting element provided on the light receiving element, a first switching element, a first electrode plate, and a sealing member. The first switching element is provided side by side on the light receiving element. A first main terminal and a control terminal are provided on an upper surface of the first switching element. A second main terminal is provided on a lower surface of the first switching element. The first main terminal is connected to the first output terminal. The control terminal is connected to the second output terminal. An upper surface of the first electrode plate is connected to the second main terminal. The sealing member covers the light receiving element, the light emitting element, and the first switching element. A lower surface of the first electrode plate is exposed on a lower surface of the sealing member.

First Embodiment

First of all, a first embodiment will be described.

Figure 1:
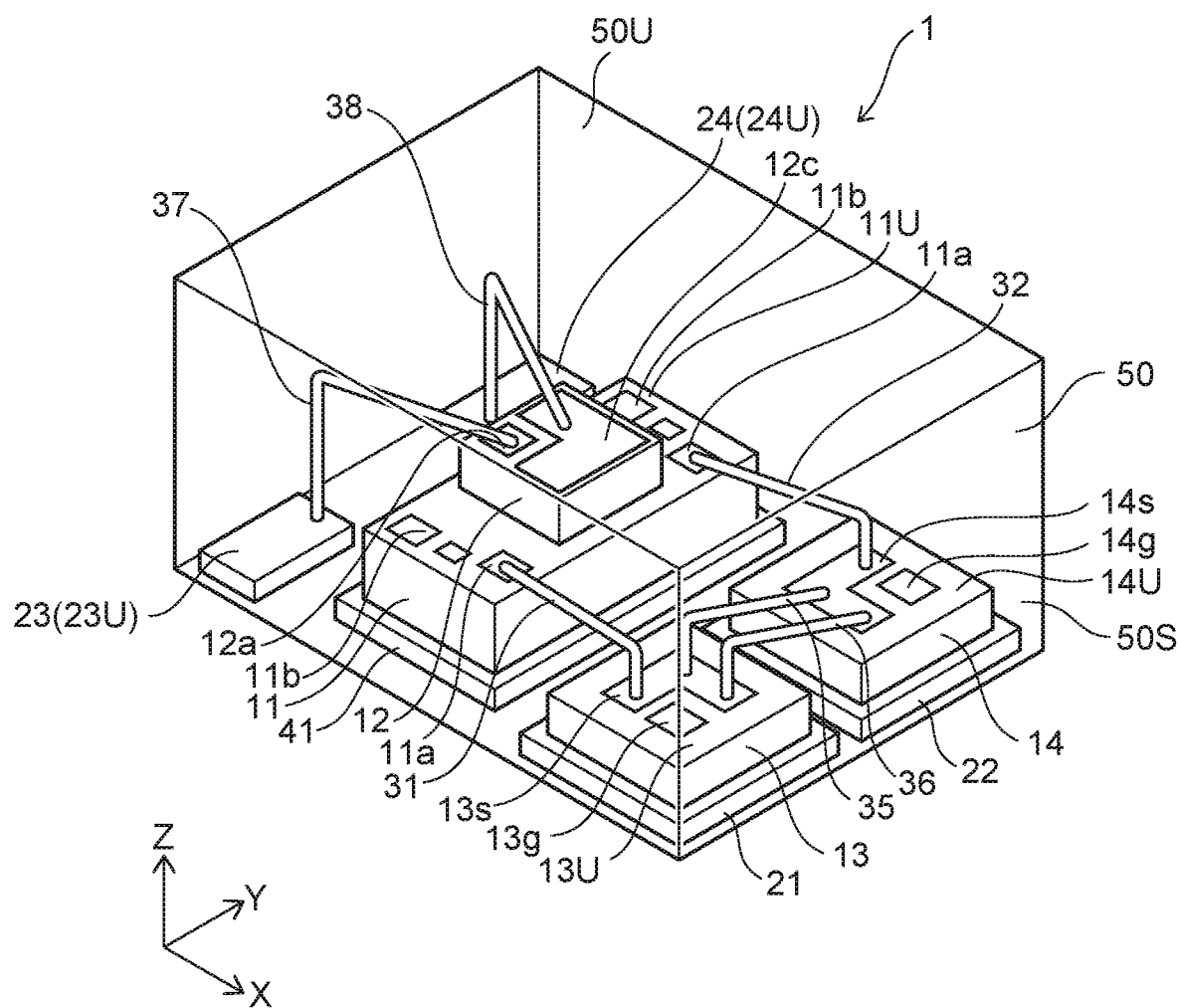
FIG. 1 is a perspective view showing an optical coupling device according to a first embodiment.

FIG. 1 is a perspective view showing an optical coupling device according to the embodiment.

Figure 2A:
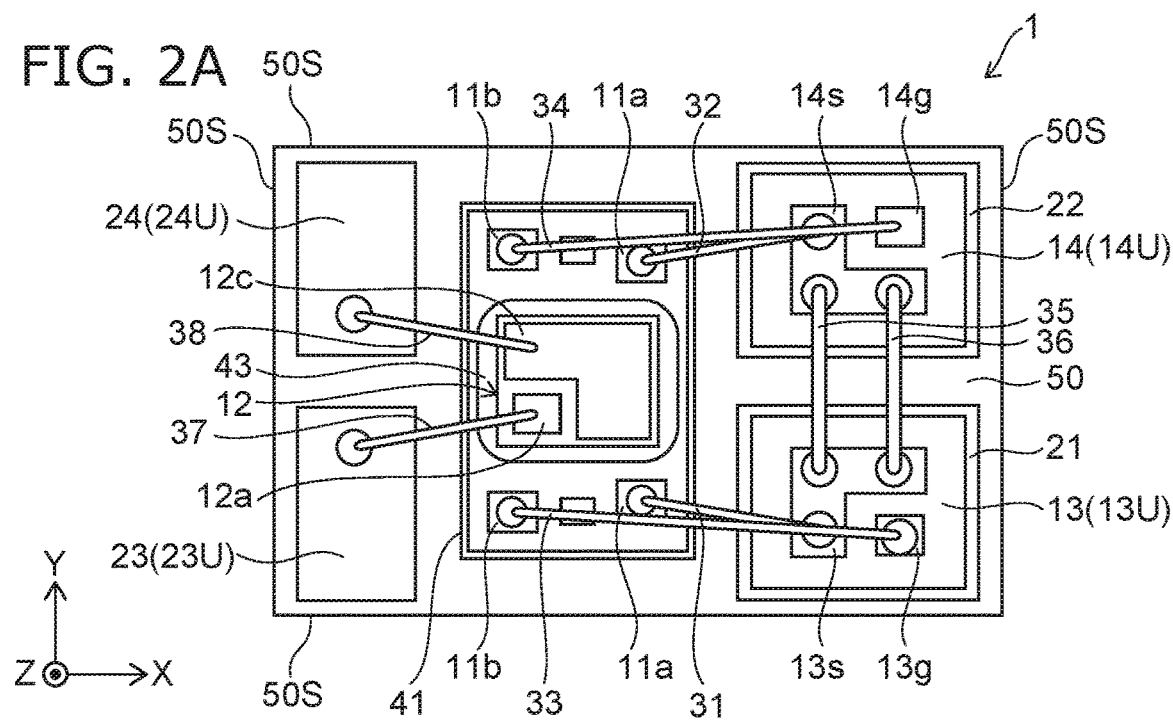
FIGS. 2A to 2C are three-directional views showing the optical coupling device according to the first embodiment.
Figure 2B:
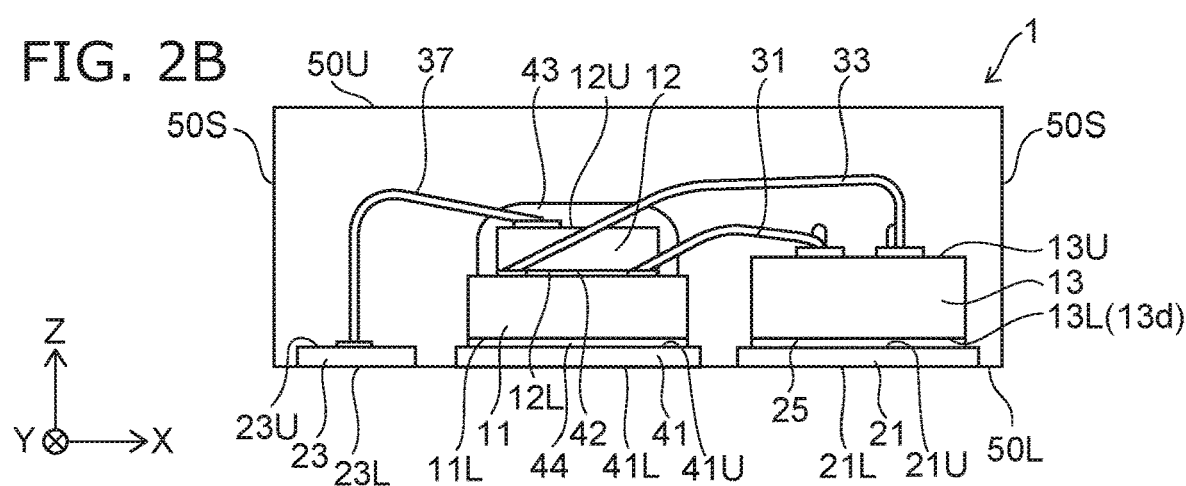
Figure 2C:
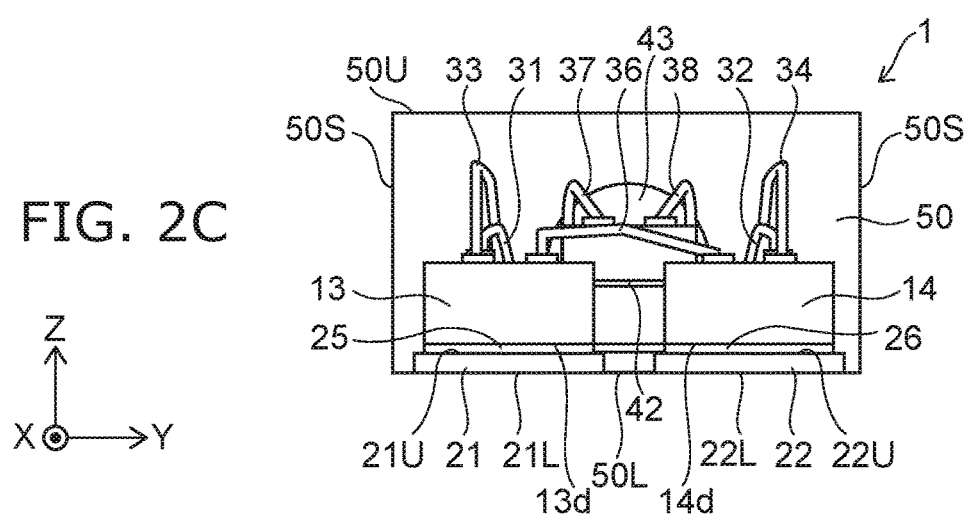

FIGS. 2A to 2C are three-directional views showing the optical coupling device according to the embodiment.

Figure 3:
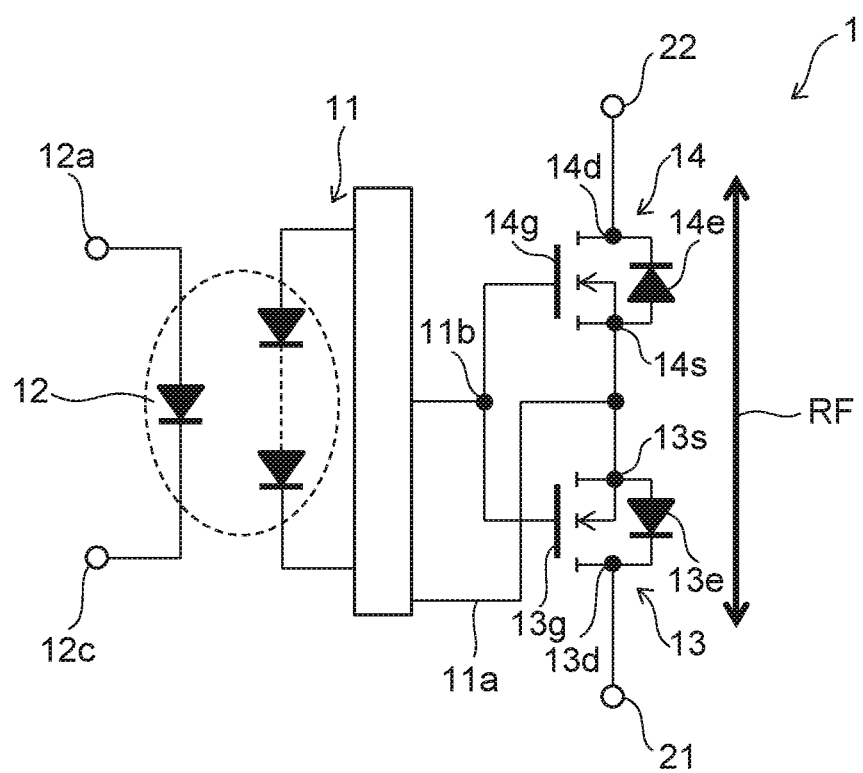
FIG. 3 is a circuit diagram showing the optical coupling device according to the first embodiment.

FIG. 3 is a circuit diagram showing the optical coupling device according to the embodiment.

Figure 4A:
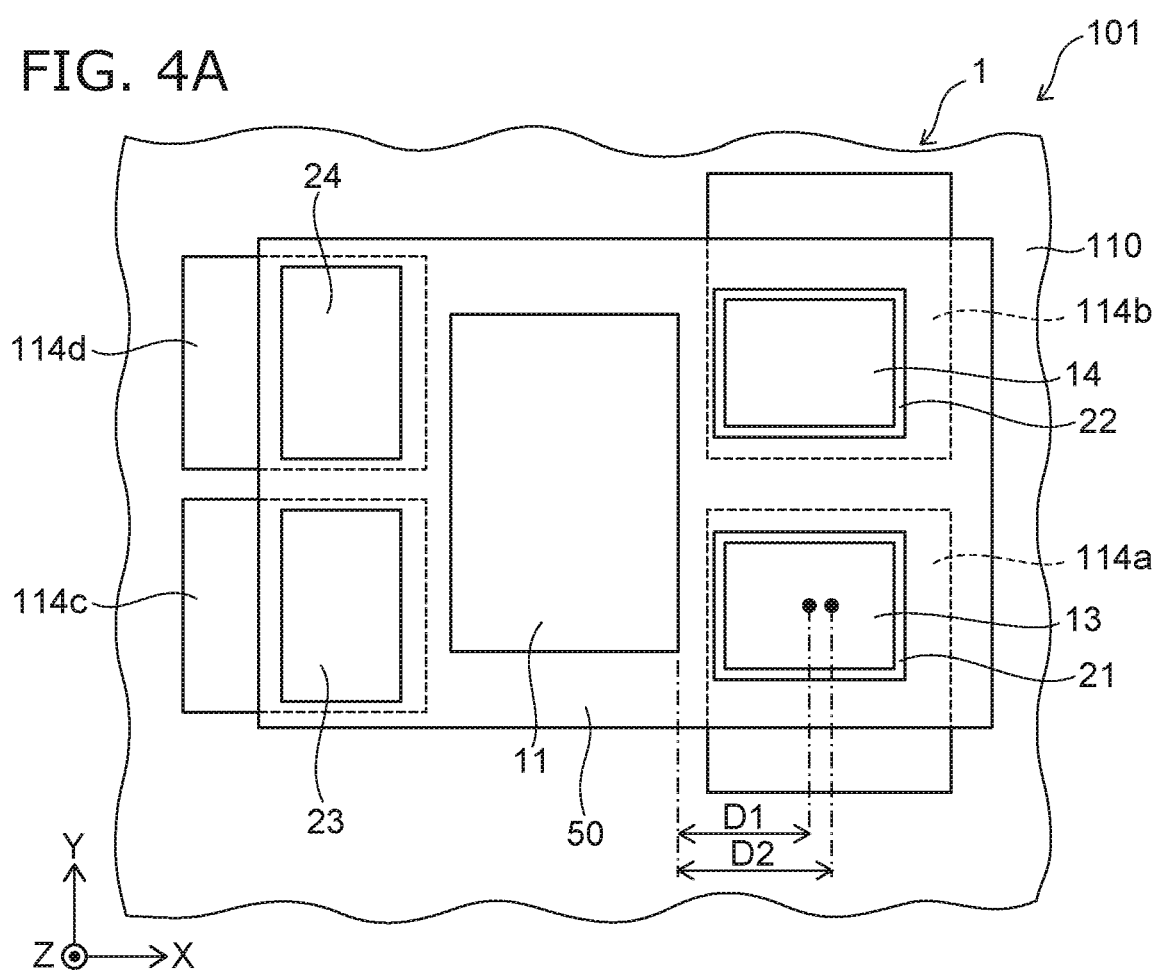
FIG. 4A is a plan view showing a high frequency device according to the first embodiment.
Figure 4B:
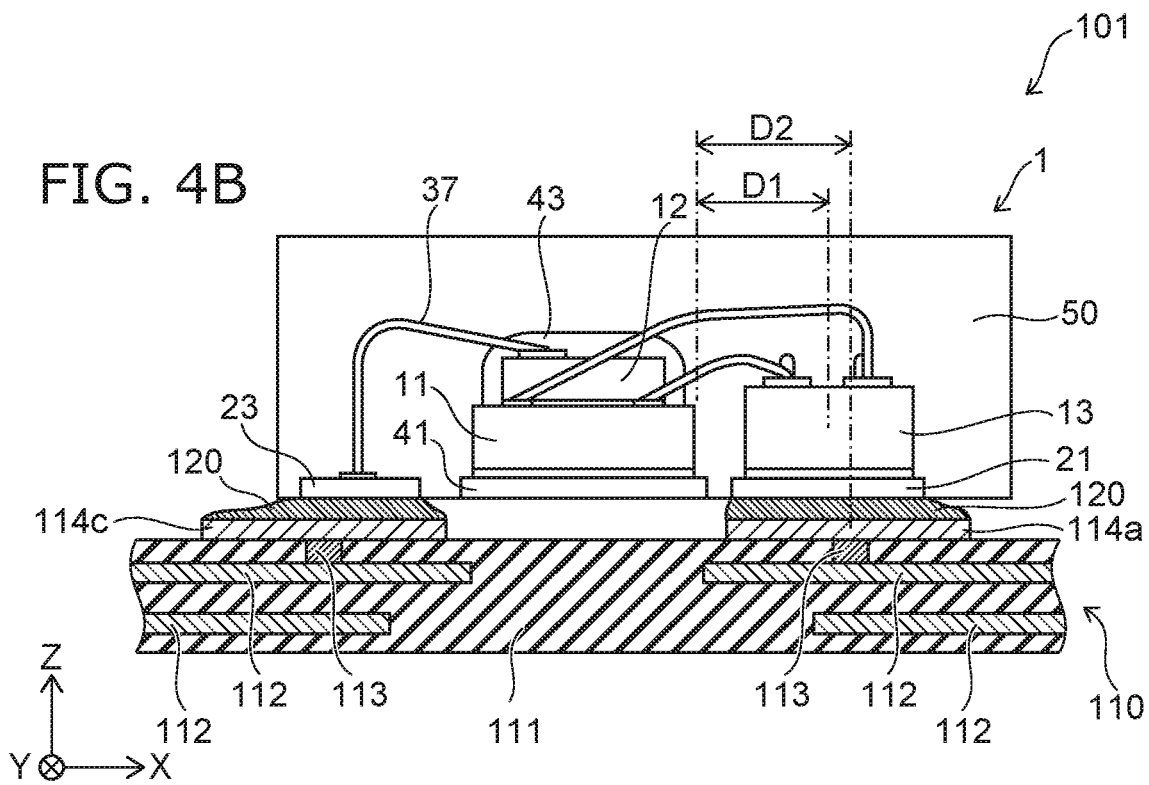
FIG. 4B is a cross sectional view showing the high frequency device.

FIG. 4A is a plan view showing a high frequency device according to the embodiment, FIG. 4B is a cross sectional view showing the high frequency device.

The optical coupling device according to the embodiment is, for example, a photo relay.

As shown in FIG. 1 to FIG. 3, in the optical coupling device 1 according to this embodiment, a light receiving element 11, a light emitting element 12, a MOSFET 13, and a MOSFET 14 are provided as functional elements. The MOSFETs 13 and 14 are vertical metal-oxide semiconductor field effect transistors. Further, electrode plates 21 to 24, connection layers 25 and 26, and wires 31 to 38 are provided in the optical coupling device 1 as connection members. Further, a metal plate 41, an adhesive layer 42, a light transmitting member 43, an adhesive layer 44, and a sealing member 50 are provided in the optical coupling device 1 as structural members. Note that, in order to make the drawing easy to see, the wires 33 and 34, the light transmitting member 43, the connection layers 25 and 26, and the adhesive layers 42 and 44 are omitted in FIG. 1. In FIG. 4A, components other than the light receiving element 11, the MOSFETs 13 and 14, the electrode plates 23 and 24, and the sealing member 50 are omitted.

The light receiving element 11 is an element that outputs an electric signal according to incident light, and is, for example, a photodiode array. Further, an upper surface 11U is provided with a pair of output terminals 11a and a pair of output terminals 11b. When light is incident on the light receiving element 11, a voltage is generated between the output terminal 11a and the output terminal 11b. No terminals are provided on a lower surface 11L of the light receiving element 11. The light receiving element 11 is provided on the metal plate 41. The lower surface 11L of the light receiving element 11 is bonded to an upper surface 41U of the metal plate 41, for example, via the adhesive layer 44. The shape of the metal plate 41 is, for example, a rectangular plate shape. The adhesive layer 44 is, for example, insulative.

The light emitting element 12 is an element that emits light when electric power is input, and is, for example, an LED (Light Emitting Diode). The light emitting element 12 is provided on the light receiving element 11 via the adhesive layer 42. The adhesive layer 42 is a layer in which the adhesive is solidified, and is made of, for example, a transparent resin such as silicone etc. An anode terminal 12a and a cathode terminal 12c are provided on an upper surface 12U of the light emitting element 12. A region around the region where the light emitting element 12 is mounted on the upper surface 11U of the light receiving element 11 and the entire light emitting element 12 are covered with the light transmitting member 43. On the other hand, the region of the upper surface 11U of the light receiving element 11 where the pair of output terminals 11a and the pair of output terminals 11b are provided is not covered with the light transmitting member 43. The light transmitting member 43 is made of a transparent resin such as silicone and has a substantially dome shape.

The MOSFETs 13 and 14 are switching elements that control the current flowing between the first main terminal and the second main terminal based on the control voltage input to the control terminal. The MOSFETs 13 and 14 are disposed side by side on the light receiving element 11. The MOSFET 13 is provided on the electrode plate 21 via the connection layer 25, and the MOSFET 14 is provided on the electrode plate 22 via the connection layer 26. The connection layers 25 and 26 are formed of a conductive material such as solder or silver paste.

Hereinafter, in the specification, an XYZ orthogonal coordinate system is adopted for convenience of illustration.

The upward direction, that is, a direction from the light receiving element 11 to the light emitting element 12 is a "Z direction", a direction in which the MOSFETs 13 and 14 are located from the light receiving element 11 is a "X direction", and a direction from the MOSFET 13 to the MOSFET 14 is a "Y direction". A straight line connecting the light receiving element 11 and the MOSFET 13 at the shortest distance extends in the X direction, and a straight line connecting the MOSFET 13 and the MOSFET 14 at the shortest distance extends in the Y direction. Further, if necessary, the Z direction is also referred to as "+Z direction", and the direction reverse to the +Z direction, that is, the downward direction is also referred to as "−Z direction". The same applies to the X direction and the Y direction.

An upper surface 13U of the MOSFET 13 is provided with a source terminal 13s as a first main terminal and a gate terminal 13g as a control terminal. A drain terminal 13d as a second main terminal is provided on a lower surface 13L of the MOSFET 13. The drain terminal 13d is connected to an upper surface 21U of the electrode plate 21 via the connection layer 25. Similarly, a source terminal 14s and a gate terminal 14g are provided on an upper surface 14U of the MOSFET 14. A drain terminal 14d is provided on a lower surface 14L of the MOSFET 14. The drain terminal 14d is connected to an upper surface 22U of the electrode plate 22 via the connection layer 26.

In the MOSFET 13, a diode 13e that allows a current to flow from the source terminal 13s toward the drain terminal 13d is provided. Similarly, in the MOSFET 14, a diode 14e that allows a current to flow from the source terminal 14s toward the drain terminal 14d is provided.

The source terminal 13s of the MOSFET 13 is connected to one output terminal 11a of the light receiving element 11 via the wire 31. The source terminal 14s of the MOSFET 14 is connected to the other output terminal 11a of the light receiving element 11 via the wire 32. Therefore, the same potential is applied to the source terminals 13s and 14s from the pair of output terminals 11a. Note that only one output terminal 11a of the light receiving element 11 is provided, and the wire 31 and the wire 32 may be connected to this one output terminal 11a. In this case, both the source terminal 13s of the MOSFET 13 and the source terminal 14s of the MOSFET 14 are connected to one output terminal 11a.

The gate terminal 13g of the MOSFET 13 is connected to one output terminal 11b of the light receiving element 11 via the wire 33. The gate terminal 14g of the MOSFET 14 is connected to the other output terminal 11b of the light receiving element 11 via the wire 34. Therefore, the same potential is applied to the gate terminals 13g and 14g from the pair of output terminals 11b. Only one output terminal 11b of the light receiving element 11 is provided, and the wire 33 and the wire 34 may be connected to this one output terminal 11b. In this case, both the gate terminal 13g of the MOSFET 13 and the gate terminal 14g of the MOSFET 14 are connected to one output terminal 11b.

The wires 35 and 36 connect the source terminal 13s of the MOSFET 13 to the source terminal 14s of the MOSFET 14. One end of the wire 35 is connected to the source terminal 13s, the other end is connected to the source terminal 14s, and the portions other than both ends are positioned above the MOSFETs 13 and 14. The same applies to the wire 36. That is, the wires 35 and 36 straddle the gap between the MOSFET 13 and the MOSFET 14 above the MOSFETs 13 and 14 (on the Z direction side). Viewed from above, for example, the wires 35 and 36 extend in the Y direction. Preferably, the wires 35 and 36 are parallel to each other, at least when viewed from above. More preferably, the three-dimensional shape of the wires 35 and 36 is a mirror image with respect to the YZ plane, or is left-right inverted symmetric when viewed from the X direction. Note that the wires 35 and 36 do not have to be parallel to each other, mirror images, or left-right inverted symmetry.

The wires 35 and 36 connect the source terminal 13s and the source terminal 14s at the shortest distance within the allowable range of the wire bonding conditions, and the length thereof is about 0.5 mm. The distance between the electrode plate 21 and the electrode plate 22 is preferably made as short as possible within the range that does not hinder the assembly, but is preferably 0.3 mm or more in order to maintain the withstand voltage. The diameter of the wires 35 and 36 is preferably 38 μm or more. When the source terminal 13s and the source terminal 14s are connected by three or more wires, the diameter of each wire is preferably 28 μm or more. This is because when connecting with three or more wires, it becomes easier to secure the total cross-sectional area as compared with when connecting with two wires, but it is difficult to secure the distance between the wires.

The electrode plates 23 and 24 are disposed in the −X direction when viewed from the metal plate 41. The electrode plate 23 and the electrode plate 24 are arranged along the Y direction. Therefore, the metal plate 41 is disposed between the electrode plate 21 and the electrode plate 23, and between the electrode plate 22 and the electrode plate 24. An upper surface 23U of the electrode plate 23 is connected to the anode terminal 12a of the light emitting element 12 via the wire 37. An upper surface 24U of the electrode plate 24 is connected to the cathode terminal 12c of the light emitting element 12 via the wire 38.

The electrode plates 21 to 24 function as external electrodes of the optical coupling device 1. On the other hand, the metal plate 41 has no electrical function and is, for example, electrically floated. The metal plate 41 supports the light receiving element 11 in the manufacturing process of the optical coupling device 1. The electrode plates 21 to 24 and the metal plate 41 are different portions of the same lead frame in the manufacturing process of the optical coupling device 1. Therefore, the electrode plates 21 to 24 and the metal plate 41 have substantially the same position, thickness, and composition in the Z direction.

Each of the electrode plates 21 to 24 and the metal plate 41 has a rectangular plate shape. When viewed from the Z direction, the electrode plate 21 is one size larger than the MOSFET 13, the electrode plate 22 is one size larger than the MOSFET 14, and the metal plate 41 is one size larger than the light receiving element 11. In the electrode plates 21 to 24 and the metal plate 41, for example, a main body made of nickel is plated with gold. The thickness of the electrode plates 21 to 24 and the metal plate 41 is, for example, 0.1 mm or less. The electrode plates 21 to 24 and the metal plate 41 may be a single-layer plate, or a stacked plate in which two or more metal layers are stacked. Further, the shape may be such that the upper portion is one size larger than the lower portion. The wires 31 to 38 are made of, for example, gold or an alloy such as a gold alloy having a low resistivity, and preferably have a lower impedance than a single wire connection with respect to a transmitted high frequency signal.

The sealing member 50 covers the light receiving element 11, the light emitting element 12, the MOSFETs 13 and 14, the electrode plates 21 to 24, the connection layers 25 and 26, the wires 31 to 38, the metal plate 41, the adhesive layer 42, and the light transmitting member 43. The sealing member 50 is made of a black resin material, for example, an epoxy resin. The outer shape of the sealing member 50 is, for example, a rectangular parallelepiped. A lower surface 21L of the electrode plate 21, a lower surface 22L of the electrode plate 22, a lower surface 23L of the electrode plate 23, a lower surface 24L of the electrode plate 24, and a lower surface 41L of the metal plate 41 are exposed on a lower surface SOL of the sealing member 50. The lower surface SOL of the sealing member 50, the lower surface 21L of the electrode plate 21, the lower surface 22L of the electrode plate 22, the lower surface 23L of the electrode plate 23, the lower surface 24L of the electrode plate 24, and the lower surface 41L of the metal plate 41 form the same plane. Further, metal members such as electrode plates are not exposed on an upper surface 50U and four side surfaces 50S of the sealing member 50. The length in the X direction of the optical coupling device 1 is, for example, 2.00 mm, the length in the Y direction is 1.45 mm, and the length in the Z direction is, for example, 1.0 mm.

As shown in FIG. 4, a substrate 110 is provided in the high frequency device 101 according to the embodiment. The substrate 110 is, for example, a glass epoxy substrate. An insulating base material 111 is provided in the substrate 110, and a wiring 112 and a via 113 are provided in the base material 111. Further, electrode pads 114a to 114d are provided on the upper surface of the substrate 110. The electrode pads 114a to 114d are connected to mutually different wirings 112 via 113, respectively.

The optical coupling device 1 described above is mounted on the substrate 110 via a bonding member 120. The bonding member 120 is, for example, cream solder printed on the electrode pads 114a to 114d of the substrate 110. The electrode pads 114a to 114d are connected to the electrode plates 21 to 24 via the bonding member 120, respectively. That is, the electrode pad 114a is connected to the electrode plate 21, the electrode pad 114b is connected to the electrode plate 22, the electrode pad 114c is connected to the electrode plate 23, and the electrode pad 114d is connected to the electrode plate 24. The high frequency device 101 according to the embodiment is, for example, a contact point switching device for a semiconductor tester. Multiple, for example, several thousand optical coupling devices 1 may be mounted on one substrate 110.

In the X direction, that is, in the direction from the light receiving element 11 to the MOSFET 13, a distance D1 between the end of the light receiving element 11 of the optical coupling device 1 and the center of the MOSFET 13 is preferably not more than a distance D2 between the end of the light receiving element 11 and the center of the electrode pad 114a of the substrate 110. That is, it is preferable that D1 D2. Similarly, a distance between the light receiving element 11 and the center of the MOSFET 14 is preferably not more than a distance between the light receiving element 11 and the center of the electrode pad 114b.

Next, the operation of the optical coupling device 1 according to the embodiment will be described.

The electrode plates 21 to 24 are each connected to the substrate 110 via the bonding member 120. A high frequency current RF is applied between the electrode plate 21 and the electrode plate 22. The high frequency current RF is used, for example, as a high frequency signal for testing when testing a semiconductor device. The frequency of the high frequency current RF is, for example, 10 GHz or higher, for example, about 20 to 24 GHz. When the MOSFETs 13 and 14 are off, the high frequency current RF does not substantially pass through the optical coupling device 1.

When a predetermined direct current voltage is applied between the electrode plate 23 and the electrode plate 24, a direct current voltage is applied between the anode terminal 12a and the cathode terminal 12c of the light emitting element 12 via the wires 37 and 38, and the light emitting element 12 emits light. The light emitted from the light emitting element 12 enters the light receiving element 11 via the adhesive layer 42 or the light transmitting member 43. As a result, a voltage is generated between the output terminal 11a and the output terminal 11b of the light receiving element 11.

The voltage output from the light receiving element 11 is applied between the source terminal 13s and the gate terminal 13g of the MOSFET 13 via the wires 31 and 33, and the MOSFET 13 is turned on. Similarly, the voltage output from the light receiving element 11 is applied between the source terminal 14s and the gate terminal 14g of the MOSFET 14 via the wires 32 and 34, and the MOSFET 14 is turned on. As a result, the high frequency current RF flows between the electrode plates 21 and 22 via the MOSFETs 13 and 14. That is, the high frequency current RF flows through a current path formed by the electrode plate 21, the connection layer 25, the MOSFET 13, the wires 35 and 36, the MOSFET 14, the connection layer 26, and the electrode plate 22, which connects the respective bonding points at a substantially shortest distance. In this way, the high frequency current RF is controlled.

Next, the effects of the embodiment will be described.

In the optical coupling device 1, the electrode plate 21 is a single thin plate, a bonding member such as solder is bonded to the lower surface 21L, and the drain terminal 13d of the MOSFET 13 is bonded to the upper surface 21U. Therefore, the inductance component of the electrode plate 21 is small, and the loss of the high frequency current RF in the electrode plate 21 is small. Similarly, since the electrode plate 22 is also a single thin plate, the high frequency current RF loss in the electrode plate 22 is small. As a result, the optical coupling device 1 has a good high frequency current transmission characteristics.

Further, in the optical coupling device 1, the source terminal 13s and the source terminal 14s are connected each other via the two wires 35 and 36. Therefore, the inductance component between the source terminal 13s and the source terminal 14s is small, and the loss of the high frequency current RF is small. It should be noted that it is conceivable to provide one thick wire instead of the wires 35 and 36. However the high frequency current RF concentrates near the surface of the wire due to the skin effect. Therefore, if the total cross sectional area is the same, the loss is smaller when many thin wires are provided.

Further, when the frequency of the high frequency current becomes about 20 GHz, the high frequency current becomes straight. Therefore, if the wires 35 and 36 have portions extending in the X direction, the high frequency current RF is oscillated in the X direction, and leaks easily occur. In the optical coupling device 1, the wires 35 and 36 are parallel to each other, pass through the Z-direction sides of the MOSFETs 13 and 14, extend in the Y-direction, and do not substantially extend in the X-direction. Therefore, the oscillation of the high frequency current RF in the X direction can be suppressed. This can also improve the transmission characteristics of the high frequency current.

Furthermore, in the high frequency device 101 according to the embodiment, the distance D1 between the end of the light receiving element 11 and the center of the MOSFET 13 in the X direction is not more than the distance D2 between the end of the light receiving element 11 and the center of the electrode pad 114a. That is, the distance D2 is not less than the distance D1. This prevents the distance (distance D2) between the electrode pads 114a and 114b and the metal plate 41 from becoming too short when the distance (distance D1) between the MOSFETs 13 and 14 and the light receiving element 11 is set to a predetermined distance. The high frequency current RF can be suppressed from leaking from the electrode pads 114a and 114b to the light receiving element 11 side including the metal plate 41.

Furthermore, in the optical coupling device 1, the metal member is not exposed on the side surface 50S of the sealing member 50. Therefore, in the process of manufacturing the optical coupling device 1, when the sealing member 50 is diced, no metal member is present on the dicing surface. Therefore, it is possible to accurately dice the sealing member 50 and suppress wear of the dicing blade. Moreover, the sealing member 50 and the metal member are not peeled off from each other on the dicing surface.

Second Embodiment

Figure 5A:
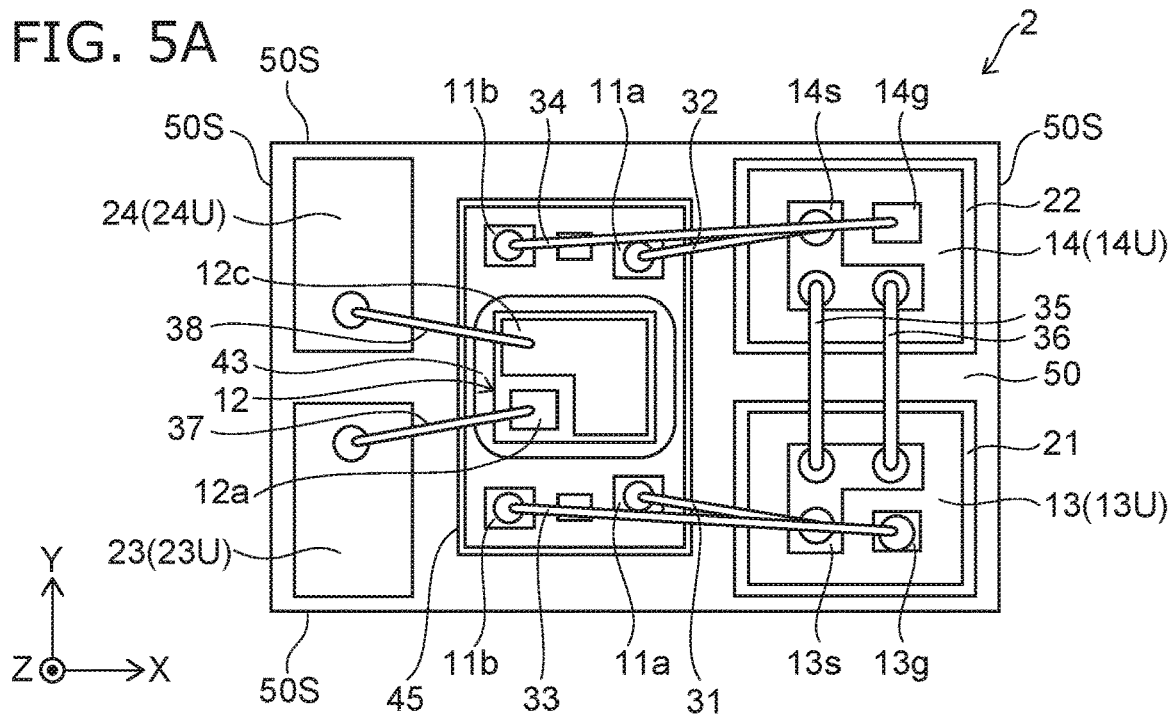
FIGS. 5A to 5C are three-directional views showing an optical coupling device according to a second embodiment.
Figure 5B:
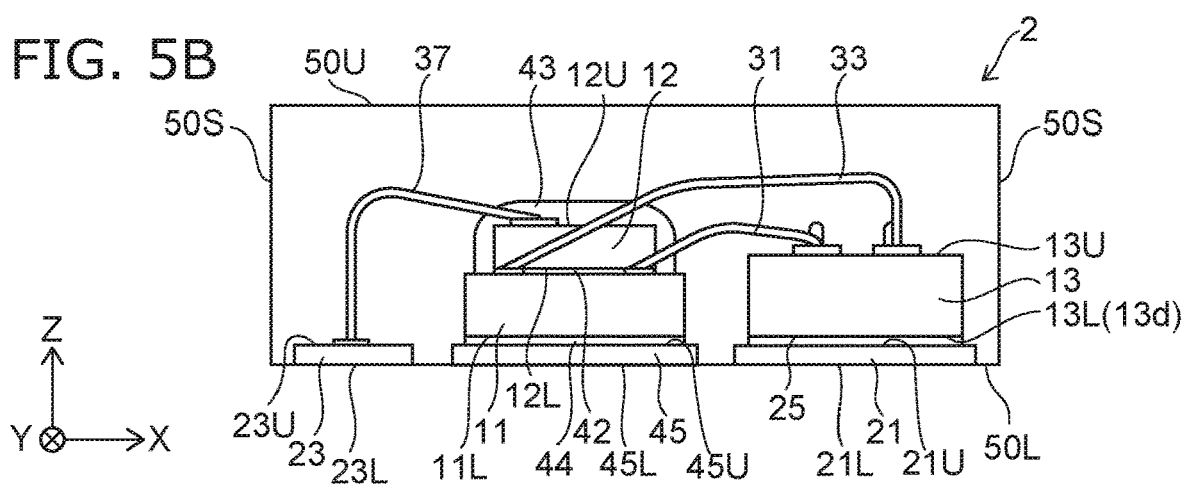
Figure 5C:
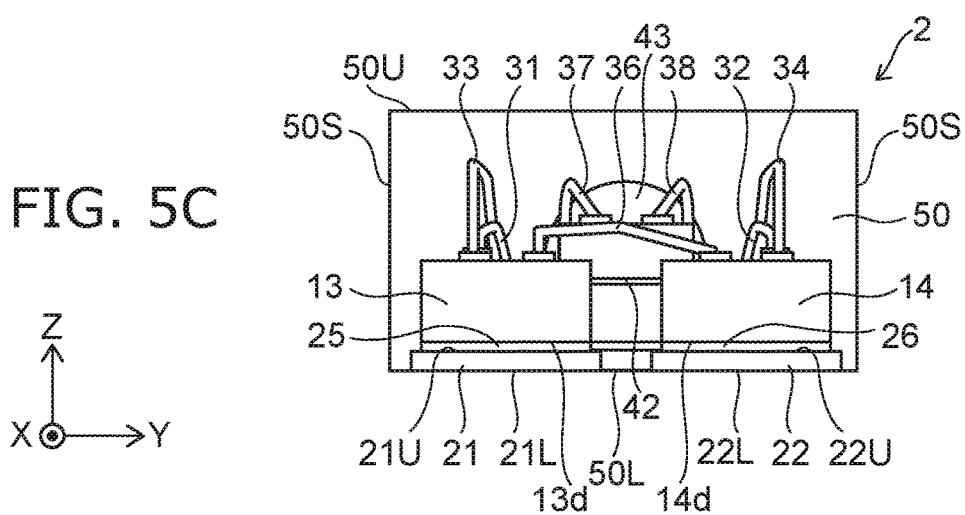

FIGS. 5A to 5C are three-directional views showing an optical coupling device according to the embodiment.

As shown in FIGS. 5A to 5C, the optical coupling device 2 according to the embodiment is different from the optical coupling device 1 according to the first embodiment (see FIG. 1 to FIG. 4) in that an insulating film 45 is provided instead of the metal plate 41. An upper surface 45U of the insulating film 45 is bonded to the lower surface 11L of the light receiving element 11, and a lower surface 45L of the insulating film 45 is exposed at the lower surface 50L of the sealing member 50. The insulating film 45 is slightly larger than the light receiving element 11 when viewed from the Z direction. The insulating film 45 may function as an insulating fixing material for fixing the light receiving element 11 to an external mounting board (not shown). The insulating film 45 is, for example, DAF (Die Attach Film) or DBE (Die Bonding Film), and is made of, for example, a material obtained by adding inorganic particles such as silica to a mixture of epoxy resin, acrylic polymer, polyimide and the like.

In the optical coupling device 2 according to the embodiment, since the insulating film 45 is provided below the light receiving element 11, the parasitic capacitance between the mounting board and the light receiving element 11 can be reduced. Further, since the metal plate 41 does not exist, the high frequency current RE does not leak from the electrode plates 21 and 22 to the mounting board via the metal plate 41. Further, it is possible to suppress the fluctuation of the transmission characteristics due to the fluctuation of the distance between the metal plate 41 and the electrode plates 21 and 22. As described above, according to the embodiment, it is possible to further improve the transmission characteristics of the high frequency current. The configuration, operation, and effect of the embodiment other than those described above are the same as those of the first embodiment.

Test Example 1

Hereinafter, a test example showing the effect of the above-described embodiment will be described.

In the test example 1, the difference between the case where the metal plate 41 is provided below the light receiving element 11 and the case where the insulating film 45 is provided will be described.

Figure 6:
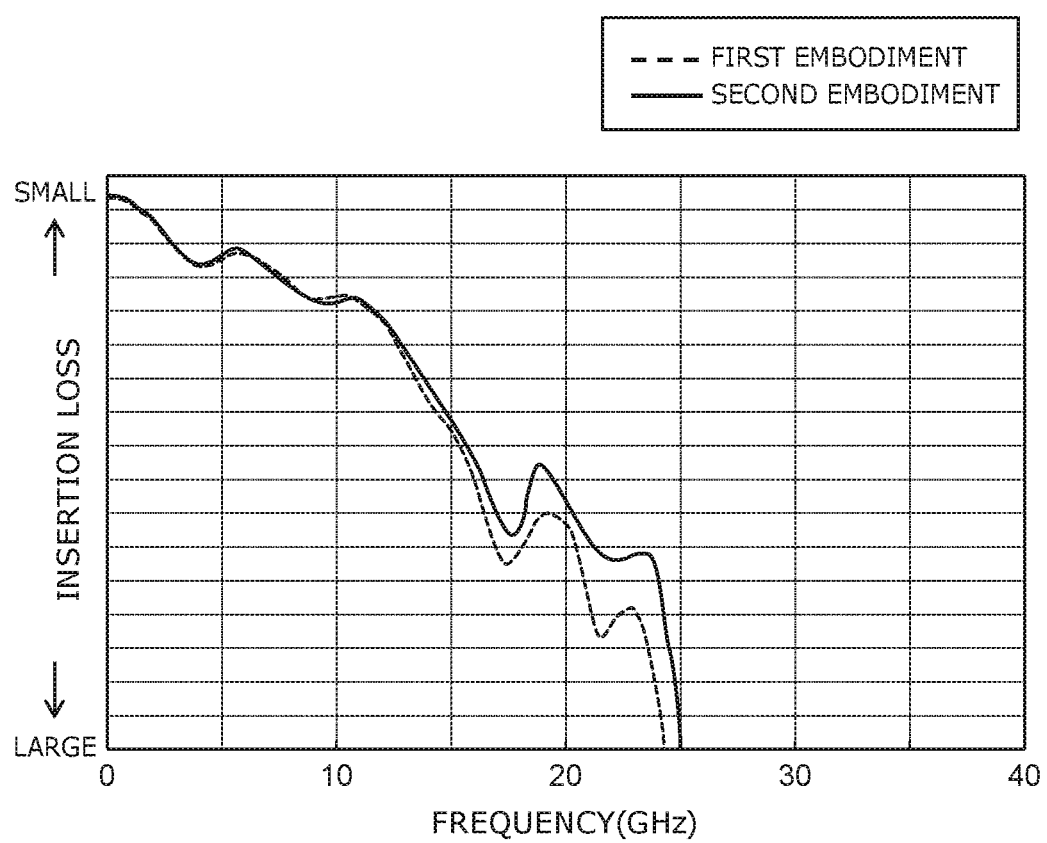
FIG. 6 is a graph view showing the effect of the characteristics of the member provided below the light receiving element on the loss of high frequency current, with the horizontal axis representing the frequency of the high frequency current and the vertical axis representing the insertion loss.

FIG. 6 is a graph view showing the effect of the characteristics of the member provided below the light receiving element on the loss of high frequency current, with the horizontal axis representing the frequency of the high frequency current and the vertical axis representing the insertion loss.

In the test example 1, assuming the optical coupling device 1 according to the first embodiment and the optical coupling device 2 according to the second embodiment described above, the frequency of the high frequency current RF is made different, and the insertion loss at each frequency is simulated. As described above, in the optical coupling device 1, the metal plate 41 is provided below the light receiving element 11, and in the optical coupling device 2, the insulating film 45 is provided below the light receiving element 11.

As shown in FIG. 6, overall, as the frequency of the high frequency current RF increased, the insertion loss increased and the loss of the high frequency current RF increased. However, in the frequency range of 10 GHz or more, the optical coupling device 2 had less insertion loss. It is presumed that this is because the leakage of the high frequency current RF was suppressed by providing the insulating film 45 instead of the metal plate 41.

Test Example 2

In the test example 2, the effect of the positional relationship between the light receiving element 11, the MOSFETs 13 and 14 of the optical coupling device 1 and the electrode pads 114a and 114b of the substrate 110 on the loss of high frequency current will be described.

Figure 7:
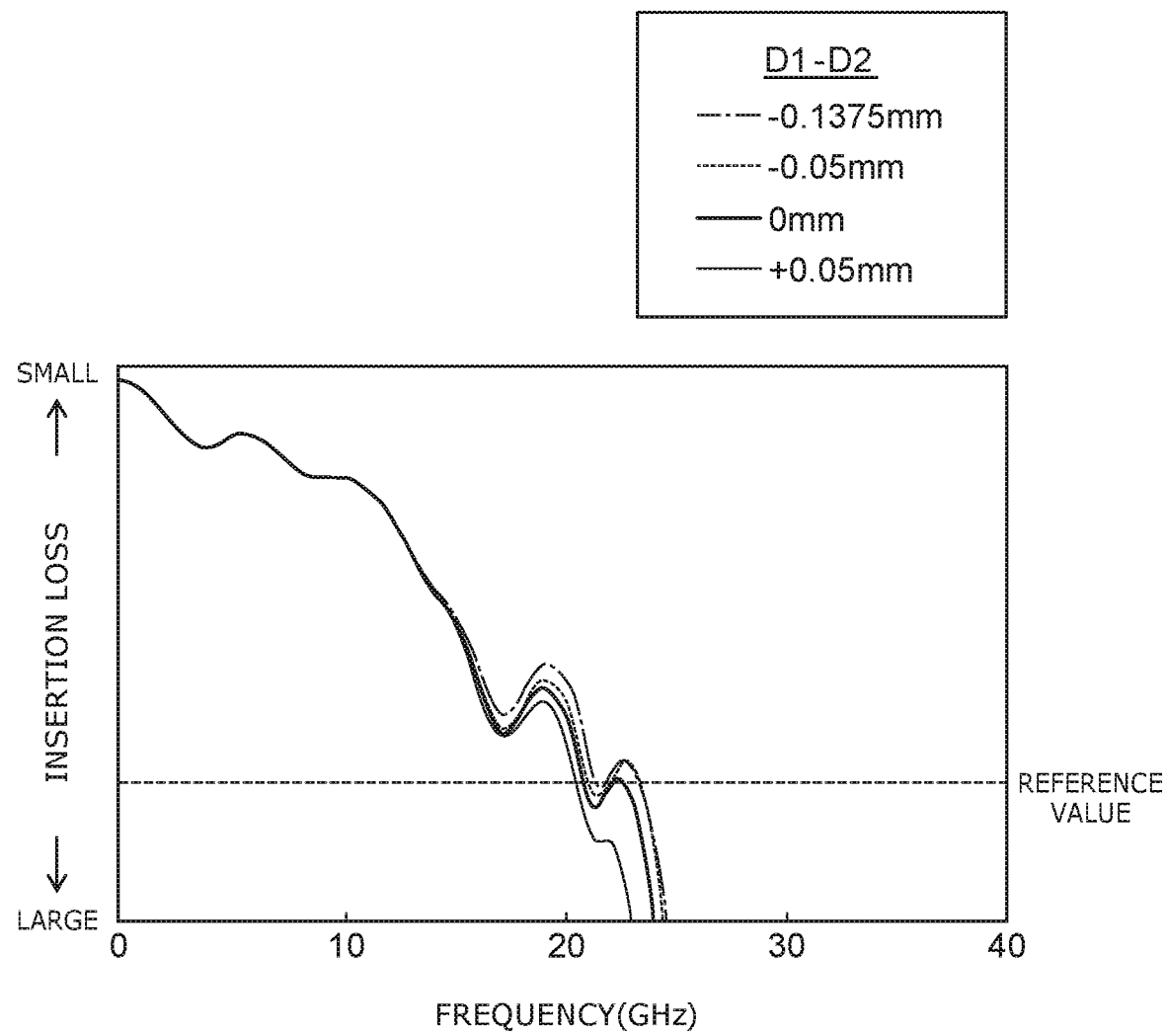
FIG. 7 is a graph view showing the effect of the distance between the metal plate and the electrode plate on the loss of high frequency current, with the horizontal axis representing the frequency of the high frequency current and the vertical axis representing the insertion loss.

FIG. 7 is a graph view showing the effect of the distance between the metal late and the electrode plate on the loss of high frequency current, with the horizontal axis representing the frequency of the high frequency current and the vertical axis representing the insertion loss.

In the test example 2, assuming the high frequency device 101 according to the first embodiment described above, the distance D1 between the light receiving element 11 and the center of the MOSFET 13 in the X direction is fixed, and the distance D2 between the light receiving element 11 and the center of the electrode pad 114a is changed. Further, in the X direction, the center position of the MOSFET 14 is set to be the same as the center position of the MOSFET 13, and the center position of the electrode pad 114b is set to be the same as the center position of the electrode pad 114a.

As for the design value of the high frequency device 101, for example, the distance D2 is equal to the distance D1, and the value of (D1−D2) is zero. When the value of (D1−D2) is positive, the distance D2 is smaller than the distance D1, and the electrode pad 114a is closer to the metal plate 41 than the design. On the contrary, when the value of (D1−D2)

is negative, the distance D2 is larger than the distance D1, and the electrode pad 114a is farther from the metal plate 41 than the design.

As shown in FIG. 7, when the value of (D1−D2) is zero or less, the insertion loss is smaller than the reference value in a wider frequency band. In other words, when the distance D2 between the light receiving element 11 and the center of the electrode pad 114a in the X direction is not less than the distance D1 between the light receiving element 11 and the center of the MOSFET 13, good transmission characteristics are obtained for the high frequency current RF in a wider frequency band.

According to the embodiments described above, it is possible to realize an optical coupling device and a high frequency device that have good high frequency current transmission characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

In each of the above-described embodiments, an example in which the optical coupling device is a photo relay has been described, but the invention is not limited to this. The optical coupling device may be, for example, a photo coupler. Further, although the example in which the high frequency device is a contact point switching device of a semiconductor tester has been described, the invention is not limited to this.

What is claimed is:

1. An optical coupling device, comprising:
   a light receiving element provided with a first output terminal and a second output terminal;
   a light emitting element provided on the light receiving element;
   a first switching element provided side by side with the light receiving element, a first main terminal and a control terminal being provided on an upper surface of the first switching element, a second main terminal being provided on a lower surface of the first switching element, the first main terminal being connected to the first output terminal, the control terminal being connected to the second output terminal;
   a first electrode plate, an upper surface of the first electrode plate being connected to the second main terminal, the second main terminal being located on the upper surface of the first electrode plate; and
   a sealing member covering the light receiving element, the light emitting element, and the first switching element, a lower surface of the first electrode plate being exposed to air at a lower surface of the sealing member.

2. The device according to claim 1, further comprising:
   a second switching element provided side by side with the light receiving element and side by side with the first switching element, a first main terminal and a control terminal being provided on an upper surface of the second switching element, a second main terminal being provided on a lower surface of the second switching element; and
   a second electrode plate, an upper surface of the second electrode plate being connected to the second main terminal of the second switching element, the second main terminal of the second switching element being located on the upper surface of the second electrode plate, a lower surface of the second electrode plate being exposed on the lower surface of the sealing member,
   a pair of the first output terminals and a pair of the second output terminals being provided,
   the first main terminal of the first switching element being connected to one of the first output terminals,
   the control terminal of the first switching element being connected to one of the second output terminals,
   the first main terminal of the second switching element being connected to another of the first output terminals, and
   the control terminal of the second switching element being connected to another of the second output terminals.

3. The device according to claim 2, further comprising:
   two wires connecting the first main terminal of the first switching element to the first main terminal of the second switching element.

4. The device according to claim 3, wherein
   a straight line connecting the light receiving element and the first switching element at a shortest distance extends in a first direction,
   a straight line connecting the first switching element and the second switching element at a shortest distance extends in a second direction, the second direction crossing the first direction, and as viewed from above, the two wires extend in the second direction.

5. The device according to claim 1, further comprising:
   a metal plate, an upper surface of the metal plate being bonded to a lower surface of the light receiving element, a lower surface of the metal plate being exposed on the lower surface of the sealing member.

6. The device according to claim 1, further comprising:
   an insulating film, an upper surface of the insulating film being bonded to a lower surface of the light receiving element, a lower surface of the insulating film being exposed on the lower surface of the sealing member.

7. The device according to claim 1, further comprising:
   a third electrode plate connected to an anode terminal of the light emitting element, a lower surface of the third electrode plate being exposed on the lower surface of the sealing member; and
   a fourth electrode plate connected to a cathode terminal of the light emitting element, a lower surface of the fourth electrode plate being exposed on the lower surface of the sealing member.

8. The device according to claim 1, wherein
   a metal member is not exposed on a side surface of the sealing member.

9. A high frequency device, comprising:
   a substrate; and
   the optical coupling device according to claim 1, the optical coupling device being mounted on the substrate,
   the substrate including a first electrode pad connected to the first electrode plate, and
   in a direction from the light receiving element toward the first switching element, a distance between the light receiving element and a center of the first switching element being not more than a distance between the light receiving element and a center of the first electrode pad.

10. The device according to claim 1, wherein the first electrode plate has a rectangular plate shape.

11. The device according to claim 2, wherein the second electrode plate has a rectangular plate shape.

* * * * *